United States Patent [19]

Sato

[11] 3,722,080

[45] Mar. 27, 1973

[54] METHOD FOR PRODUCING THE BASE OF A SEMICONDUCTOR DEVICE

[76] Inventor: Yoshio Sato, 42-32 Ogikubo, 2-chome, Suginami-ku Tokyo, Japan

[22] Filed: Nov. 12, 1971

[21] Appl. No.: 198,158

[30] Foreign Application Priority Data

Nov. 16, 1970 Japan ............................45/100239
Jan. 29, 1971 Japan ............................46/2856

[52] U.S. Cl. ..........................................29/581
[51] Int. Cl. ....................B21k 23/00, H01l 17/00
[58] Field of Search........29/590, 589, 583, 581, 580, 29/576, 569

[56] References Cited

UNITED STATES PATENTS

| | | | |
|---|---|---|---|
| 3,197,843 | 8/1965 | Nippert | 29/581 |
| 3,348,297 | 10/1967 | Dijkmeijer | 29/581 |

*Primary Examiner*—Milton S. Mehr
*Attorney*—George V. Woodling et al.

[57] ABSTRACT

In a method for producing the base of a semiconductor device from a composite metal workpiece comprising a lower metal layer possessing high electric and thermal conductivities and an upper metal layer clad on the lower metal layer and possessing high electric resistance suitable for electric resistance welding, a semiconductor pellet or element mounting raised portion formed in the workpiece as the workpiece is deformed to a predetermined final base shape is removed the upper metal layer therefrom so as to expose the lower metal layer on the upper surface of the raised portion whereby the exposed metal layer is ready for directly mounting a semiconductor pellet thereon. Alternatively, the workpiece is deformed so as to elongate the upper metal layer in the raised portion to reduce its thickness whereby the surface of the thinned metal layer is ready for mounting a semiconductor pellet thereon.

4 Claims, 11 Drawing Figures

INVENTOR.
Yoshio Sato
BY Woodling, Krost, Granger and Rust, attys.

INVENTOR.
Yoshio Sato
BY Woodling, Krost, Granger and Rust, Attys.

METHOD FOR PRODUCING THE BASE OF A SEMICONDUCTOR DEVICE

BACKGROUND OF THE INVENTION

This invention relates to improved methods for producing semiconductors and more particularly, to improved methods for producing the bases or mounts of semiconductor devices such as diodes transistors, thyristors and the like.

In general, the enclosure for a semiconductor device comprises a base or mount adapted to mount a semiconductor element or pellet and a cover or cap shell adapted to enclose the semiconductor element or pellet. A terminal or terminals of the semiconductor element are fixedly secured to either the base or cap shell. The base is generally formed of a metal such as copper which possesses high electric and thermal conductivities through which the current and heat from the semiconductor element can be easily conducted and the cap shell is generally formed of iron or "Kovar" alloy. The cap shell is fixedly secured at its outer flange to the upper surface of the base at the peripheral edge of the latter by welding. However, since copper of which the base is formed possesses a high electrical conductivity and is not applicable to electric resistance welding, the flange of the cap shell formed of iron or "-Kovar" alloy can not be directly welded to the copper base.

A semiconductor device comprising the base the surface of which has a metal layer suitable for electric resistance welding is disclosed in U.S. Pat. No. 3,119,052 issued Jan. 21, 1964. To describe briefly, the semiconductor device of the afore-mentioned U.S. Pat. has an enclosure or housing which comprises the base formed of a composite metal including a thicker metal layer formed of a metal of high electric and thermal conductivities such as coppor and a thinner metal layer clad on the copper layer and formed of a metal such as steel, nickel or nickel alloy which is suitable for electric resistance welding; and a cover or cap shell having the flange secured to the thinner metal layer of the base such as by resistance welding. It will be understood that the semiconductor pellet or element must be mounted on the copper base in a thermally and electrically conductive relationship to the base. The pellet is usually mounted on a raised portion formed on the upper surface of the base and the raised portion engages the inner surface of the cap shell so as to hold the cap shell in position. If the base is of a stud-type having the stem which is to be threaded into a combination cooling and ground plate, the raised portion serves to prevent the pellet from being subjected to stress which will develop as the stem is threaded into the cooling and ground plate. If the thickness of the area of the base where the pellet is mounted is insufficiently small, any stress which will develop as the base stem is threaded into the combination cooling and ground plate will be applied to the pellet. In the afore-mentioned U.S. Pat., there is disclosed that after the nickel layer which is the so-called high electric and thermal resistance metal layer in the center of the base has been removed from the base, the base is compressively deformed so as to protrude a raised portion in the center of the base where the pellet is to be mounted. However, it is quite difficult to strip off or remove the nickel layer in the center of the base from the base material by mechanical working when the surface of the base material is flat and will undesirably make the process complicate.

It has been found that when a clad or composite metal is deformed in order to provide a raised portion in a base material where a semiconductor pellet or element is to be mounted, portion of the metal layer possessing high electrical and thermal resistances of the base material is caused to intrude into the thus formed raised portion (see FIG. 7). Such intruding metal portion of high resistance will present a cause to impede the dispersion of the heat from the pellet and as a result, the thus obtained base is not suitable for the production of a semi-conductor device which is required to possess a high current capacity.

SUMMARY OF THE INVENTION

Therefore, one principal object of the present invention is to provide a method for producing the base or mount of a semiconductor device of the above type whereby a high resistance metal layer can be easily removed from the pellet mounting area of a clad or composite metal for the base of the semiconductor.

It has been found that the high resistance metal layer may be elongated to reduce its thickness sufficient to possess a conductive relationship to the base surface as the base material on which the layer is formed is deformed thus mounting a semi-conductor element directly on the upper surface of the afore-mentioned metal layer.

Thus, another object of the present invention is to provide a method for producing the base of a semiconductor device of the above type whereby a semi-conductor element may contact the surface of the base in a satisfactory electrical and thermal conductive relationship to the base surface while eliminating the necessity for removal of a high resistance metal layer from a clad or composite metal of which the base is formed.

A further object of the present invention is to provide a method for producing the base of a semiconductor device of the above type whereby the material of the base can be deformed in such a manner that the raised portion of the base where a pellet is to be mounted will not be invaded by a high resistance metal layer of a composite metal of which the base is formed.

As one aspect of the present invention, there is provided a method for producing the base of a semiconductor device comprising a clad or composite metal which has a first area including a raised portion where a semiconductor pellet is to be mounted and a second area where the flange of a cap shell which encloses the semiconductor pellet is to be secured by electric resistance welding and said method is characterized by the steps of preparing a clad or composite metal comprising a first or lower metal layer possessing high electrical and thermal conductivities and a second or upper metal layer clad on said first metal layer and suitable for electric resistance welding; preparing workpieces by punching said composite metal to a predetermined size; deforming each of said workpieces to a predetermined final base shape by protruding the center of the workpiece toward said second metal layer so as to form a raised portion on the surface of said center which provides said first area and said second area in the remaining surface portion of the center surrounding said raised portion; and partially cutting off said raised portion in horizon so as to expose said first metal layer on the surface of the raised portion whereby the exposed metal layer is ready for mounting said semiconductor pellet thereon.

As another aspect of the present invention, there is provided a method for producing the base of a semiconductor device comprising a clad or composite metal which has a first area where a semiconductor pellet is to be mounted and a second area where the flange of a cap shell which encloses said semiconductor pellet is to be secured by electric resistance welding, and the method is characterized by the steps of preparing a composite metal comprising a first or lower metal layer of high electric and thermal conductivities and a second or upper metal layer clad on said first metal layer and suitable for electric resistance welding; preparing workpieces by punching said composite metal to a predetermined size; and deforming each of said workpieces to a predetermined final base shape by protruding the center of the workpiece toward said second metal layer so as to elongate the second metal layer to reduce its thickness thereby to form a raised portion in said center as said first area leaving the remaining surface portion surrounding the raised portion as said second area whereby the second area is ready for mounting said semiconductor pellet thereon. The above and other objects and attendant advantages of the present invention will be apparent to those skilled in the art from a reading of the following detailed description of the invention in conjunction with the accompanying drawings which show preferred embodiments of the invention for illustration purpose only, but not for limiting the same in any way.

BRIEF DESCRIPTION OF THE INVENTION

DETAILED DESCRIPTION OF THE INVENTION

Figure 1:
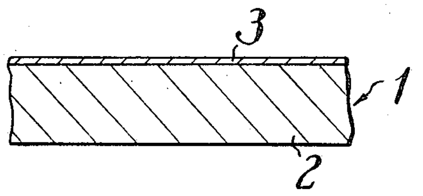
FIG. 1 is a cross-sectional view on an enlarged scale of a strip of clad or composite metal as the stock from which the base of a semiconductor device is produced according to the method of the present invention.

In FIG. 1, there is shown a strip of composite metal generally by the numeral 1 and the composite metal strip comprises a relatively thicker first or lower metal layer 2 which is formed of a metal of high electrical and thermal conductivities such as copper, aluminum or an alloy thereof, and a relatively thinner second or upper metal layer 3 clad on the first metal layer and formed of a metal of high resistance metal which is suitable for electric resistance welding such as iron, ferroalloy, nickel or cupronickel.

Figure 2:
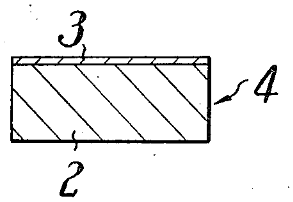
FIG. 2 is a cross-sectional view of a workpiece as the stock formed by punching said strip of the clad or composite metal.

A plurality of similar workpieces are simultaneously blanked out of the composite metal strip 1 such as by punching and each of the thus obtained workpieces has a circular configuration in horizon as shown in FIG. 2 having a predetermined diameter. In FIG. 2, only one of the workpiece is generally shown by the numeral 4.

Figure 3:
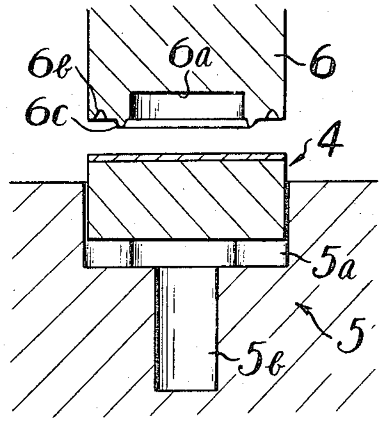
FIG. 3 is a cross-sectional view of said workpiece and mating dies showing the manner in which said workpiece of FIG. 2 is deformed in the deforming or extruding step in the method of the invention.

The workpiece 4 is then extruded to a desired final stud shape by a press. Referring to FIG. 3, there is shown portion of a lower die 5 to be secured to the die plate of the press (not shown) and portion of an upper die 6 to be secured to the ram of the press (not shown). The lower die 5 has a center recess *5a* in the upper surface for receiving the workpiece 4 and an elongated cavity *5b* extending downwardly and verically from the bottom of the recess *5a* in the center thereof. The cavity *5b* serves to form the stem in the workpiece 4 which is to be thread-rolled in a later stage of the process. The recess *5a* has a hexagonal cross-section in conformity with a predetermined configuration to be imparted to the stud as the final product whereas the cavity *5b* is of circular cross-section as seen in horizon. The upper die 6 has a relatively shallow cavity *6a* for forming the raised portion in the stud and an annular recess *6b* the depth of which is smaller than that of the cavity *6a* and which serves to form a ring projection adjacent to the outer periphery of the stud surrounding the raised portion. The cavity *6a* has a circular cross section as seen in horizon and an annular edge *6c* projecting downwardly and vertically from the bottom surface of the upper die 6.

Figure 7:
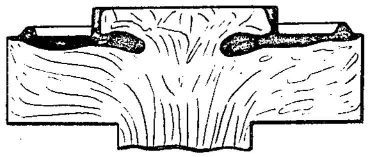
FIG. 7 is a view on an enlarged scale of a cut in a semiconductor device base obtained by deforming a composite metal workpiece in accordance with a conventional method.
Figure 8:
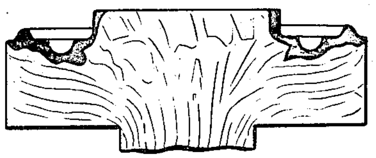
FIG. 8 is similar to FIG. 7, but shows a cut in a semiconductor device base produced by deforming a composite metal workpiece according to one aspect of the method of the invention.

When the workpiece 4 is received in the recess *5a* in the lower die 5 and the press ram is then lowered, the workpiece is deformed to the stud 7 as shown in FIG. 7. As appreciated from the showing of FIG. 4, the raised portion 8 of the stud is formed with the first or lower metal layer 2 being extruded upwardly of the upper surface of the body of the stud. It is also appreciated that an annular recess *8a* is provided surrounding the raised portion 8. The annular recess *8a* serves to prevent the second or upper metal layer 3 having high thermal resistance of the composite metal 2 forming the workpiece 4 from intruding into the raised portion 8 as the workpiece is deformed. More particularly, although the annular recess *8a* is formed by the downwardly extending edge *6c* of the upper die 6, if the die is not provided with the edge *6c* and therefore, such annular recess *8a* is not formed, when the upper or second metal layer of the workpiece 4 is elongated as the workpiece is deformed, portion of the elongated second or upper metal layer 3 tends to horizontally and inwardly invade into the raised portion 8 in the lower region of the raised portion thereby to prevent the heat from the raised portion from being dispersed. However, by the provision of such edge 6c in the upper die 6, even when the upper metal layer 3 is elongated as the workpiece 4 is deformed, the afore-mentioned portion of the elongated upper metal layer 3 only wrinkles along the cross section of the annular recess 8a (see FIG. 8) and therefore, the metal layer portion will not prevent the heat from the raised portion from dispersing. Referring to FIG. 4 again, a ring portion 9 is formed by the annular recess 6b in the upper die 6 and the ring projection is subsequently employed for projection-welding the flange of a cap shell by a conventional process. The stem 10 is formed by forceibly intruding the material of the workpiece 4 into the cavity 5b in the lower die 5 and subsequently thread-rolled by a conventional process.

Figure 5:
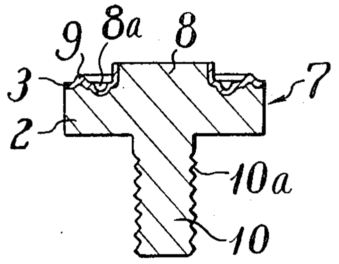
FIG. 5 is a cross-sectional view of a complete base.
Figure 4:
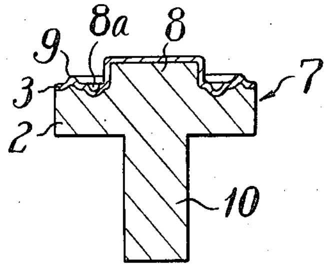
FIG. 4 is a cross-sectional view of a base blank obtained in the deforming step as shown in FIG. 3.
Figure 5A:
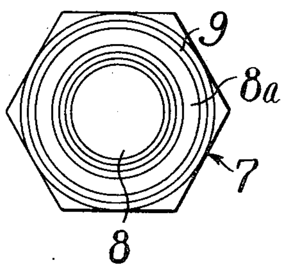
FIG. 5A is a plan view of the complete base of FIG. 5.

The stud 10 as shown in FIG. 4 is horizontally cut off in the upper region of the raised portion 8 so as to remove the second metal layer 3 as shown in FIG. 5, and as a result, on the upper surface of the raised portion 8 the first or lower metal layer possessing high electrical and thermal conductivities is exposed. The exposed upper surface of the raised portion 8 forms an area where a semiconductor pellet or element is to be mounted whereas the remaining surface region surrounding the raised portion and including the ring projection 9 forms an area where the flange of a cap shell is to be secured. FIG. 5 also shows a thread 10a in the outer periphery of the stem 10 which has been formed by thread-rolling the stem. The upper surface of the complete stud is more clearly shown in FIG. 5A.

Figure 6:
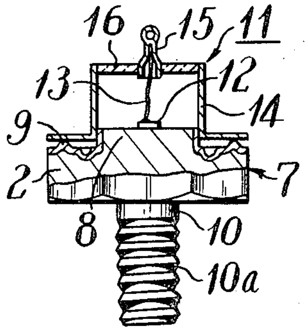
FIG. 6 is a side elevational view in partial longitudinal section of a semiconductor device in which the base of FIG. 5 is incorporated.

Turning to FIG. 6, a semiconductor device incorporating the stud of FIG. 5 therein is generally shown by the numeral 11. The semiconductor pellet or element 12 is shown as being mounted on the exposed first metal layer 2 in the raised portion 8 of the stud 7 and the element has a lead wire 13 previously soldered thereto. A cap shell 14 formed of iron or "Kovar" alloy has an opening at the top thereof and a sleeve like terminal 15 is received in the opening and hermetically sealed by means of glass 16. The cap shell also has an outwardly and horizontally extending flange 14a at the lower peripheral edge. As shown in FIG. 6, the cap shell 14 surrounds and engages the outer surface of the raised portion 8 of the stud 7 in such a manner that the lead wire 13 will be inserted in the sleeve of the terminal 15 with the lower edge flange seating on the ring portion 9 of the stud 7. Thereafter, the sleeve of the terminal 15 is drawn radially and inwardly so as to connect the lead wire 13 to the terminal 15 and the flange 14a is then projection-welded to the upper surface of the second area of the base while the flange being pressed downwardly thereby to complete a semiconductor device.

Figure 9:
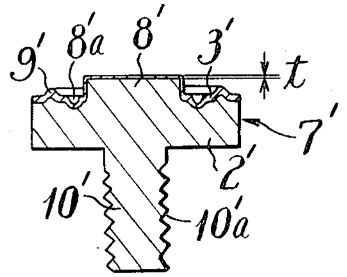
FIG. 9 is a cross-sectional view of a complete semiconductor device base produced by another aspect of the method of the invention.

Referring to FIG. 9, a stud 7' substantially similar to the stud 7 as described hereinabove and shown in FIG. 4 is shown. In the stud shown in FIG. 6, when the composite metal is extruded, the upper metal layer of the composite metal is elongated in the raised portion 8'. Accordingly, it has been found that if the second or upper metal layer in the composite metal is formed of high ductility, the thickness of the second or upper metal layer of the composite metal where a semiconductor pellet or element is to be mounted will be quite small and as a result, the heat from the semiconductive pellet will be satisfactorilly conducted across the thinly elongated upper metal layer 1' to the first or lower metal layer 2'. In this way, the stud of FIG. 9 can be completed by being subjected to the subsequent step in which the stem is threadrolled while eliminating the step of partially cutting-off the raised portion. As one example, workpieces each comprising a composite metal including a cupronickel layer having the thickness ranging from 0.3 to 0.4 mm and a copper layer having the thickness of 6 mm were extruded by the use of dies similar to those shown in FIG. 3. The resulting workpieces had the cupronickel layers of the raised portions ranging from 0.15 – 0.25 mm in thickness and the complete studs formed from such workpieces were employed in the production of semiconductor devices. Experiments have shown that the thus produced semiconductor devices had a current capacity only slightly smaller than that of the semiconductor device as shown in FIG. 6.

Figure 10:
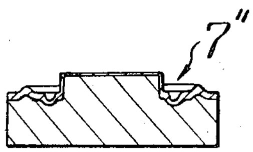
FIG. 10 is a cross-sectional view of another semiconductor device base which is produced by the same method as that employed in the production of the base of FIG. 9, but has a different configuration from that of the base of FIG. 9.

FIG. 10 shows a base which is substantially identical with the stud as shown in FIG. 9 except that the stem 10' shown in FIG. 9 is not provided. The base of FIG. 10 has the end of a lead wire (not shown) spot-welded to the lower surface. Although not shown, the base of FIG. 10 may be provided with a flange having holes through which screws extend and are threaded in the threaded holes of the mounting plate of a radiator (not shown) to secure the flange to the radiator.

In the foregoing, although description has been made of several preferred embodiments of the invention which are considered as most preferable at present time, it will be readily occurred to those skilled in the art that the same are for illustration purposes only and are not to be taken as a definition of the invention, reference being had for this purpose to the appended claims. For example, the harmetically sealed terminal or terminals may extend through the body of the base instead of the cap shell as desired and in the base as shown in FIG. 10 which has no stem, the upper metal layer in the raised portion may be removed as desired.

What is claimed is:

1. A method for producing the base of a semiconductor device which comprises a first area including a raised area where a semi-conductor pellet is to be mounted and a second area where the flange of a cap shell adapted to enclose said semiconductor pellet is to be secured by electric resistance welding, said method comprising the steps of preparing a clad or composite metal including a first or lower metal layer possessing high electric and thermal conductivities and a second or upper metal layer clad on said first metal layer and suitable for electric resistance welding; preparing workpieces by punching said composite metal to a predetermined size; deforming each of said workpiece to a predetermined final base shape so as to protrude the workpiece in the center thereof toward said second metal layer thereby to form a raised portion which provides said first area and said second area in the remaining sur-face region surrounding said raised portion; exposing said first metal layer on the upper surface of said raised portion by cutting off portion of said raised portion in horizon whereby the upper surface of said exposed metal layer is ready for mounting said semiconductor pellet thereon.

2. The method for producing the base of a semiconductor device as set forth in claim 1, in which during said deforming step an annular recess is formed in the surface of said workpiece surrounding said raised portion whereby said second metal layer is prevented from intruding into the raised portion.

3. The method for producing the base of a semiconductor device which comprises a first area including a raised portion where a semi-conductor pellet is to be mounted and a second area where the flange of a cap shell adapted to enclose said semiconductor pellet is to be secured by electric resistance welding, said method comprising the steps of preparing a composite metal including a first or lower metal layer possessing high electric and thermal conductivities and a second or upper metal layer clad on said first metal layer and suitable for electric resistance welding; preparing workpieces by punching said composite metal to a predetermined size; deforming each of said workpieces to a predetermined final base shape so as to protrude the workpiece in the center thereof toward said second metal layer to elongate the metal layer to reduce its thickness and at the same time to form a raised portion in the surface of the workpiece as said first area and also said second area in the remaining surface region of the workpiece surrounding the raised portion whereby the surface of said second area is ready for mounting said semiconductor pellet thereon by electric resistance welding.

4. The method for preparing the base of a semiconductor device as set forth in claim 3, in which during said deforming step an annular recess is formed in the surface of said workpiece surrounding said raised portion whereby said second or upper metal layer of the workpiece is prevented from intruding into said raised portion.

* * * * *